US008552287B2

United States Patent
Lu et al.

(10) Patent No.: US 8,552,287 B2
(45) Date of Patent: Oct. 8, 2013

(54) STACKED-LAYERED THIN FILM SOLAR CELL AND MANUFACTURING METHOD THEREOF

(75) Inventors: Chun-Hsiung Lu, Houli Township, Taichung County (TW); Chien-Chung Bi, Houli Township, Taichung County (TW)

(73) Assignee: Nexpower Technology Corporation, Taichung (TW)

( * ) Notice: Subject to any disclaimer, the term of this patent is extended or adjusted under 35 U.S.C. 154(b) by 997 days.

(21) Appl. No.: 12/193,071

(22) Filed: Aug. 18, 2008

(65) Prior Publication Data

US 2009/0272429 A1 Nov. 5, 2009

(30) Foreign Application Priority Data

Apr. 30, 2008 (TW) ................................ 97115847 A

(51) Int. Cl.
*H01L 31/05* (2006.01)
(52) U.S. Cl.
USPC ......................................... 136/256
(58) Field of Classification Search
USPC ................................. 136/243–265
See application file for complete search history.

(56) References Cited

U.S. PATENT DOCUMENTS

| | | | |
|---|---|---|---|
| 5,021,100 A | 6/1991 | Ishihara et al. | |
| 6,271,053 B1 | 8/2001 | Kondo | |
| 6,300,556 B1 | 10/2001 | Yamagishi et al. | |
| 6,632,993 B2 | 10/2003 | Hayashi et al. | |
| 6,870,088 B2 | 3/2005 | Tachibana et al. | |
| 2002/0066478 A1* | 6/2002 | Hayashi et al. | 136/244 |
| 2003/0172967 A1* | 9/2003 | Tachibana et al. | 136/244 |
| 2006/0266409 A1 | 11/2006 | Takeda et al. | |
| 2009/0165851 A1* | 7/2009 | Sekimoto et al. | 136/256 |

\* cited by examiner

*Primary Examiner* — Jonathan Johnson
*Assistant Examiner* — Christina Chern
(74) *Attorney, Agent, or Firm* — Che-Yang Chen; Law Office of Michael Chen

(57) ABSTRACT

A stacked-layered thin film solar cell has a plurality of independent unit cells comprising a substrate, a first electrode layer, a first photoconductive layer, an interlayer, a second photoconductive layer, and a second electrode layer in a series stacked structure, wherein at least one first separation groove is formed within the first electrode layer and the stacked-layered thin film solar cell is characterized in: at least one second separation groove formed on the interlayer, at least one connection groove passing through the first photoconductive layer and the second photoconductive layer, and at least one third separation groove extending downward at a periphery of each of the unit cells so that the connection grooves and the third separation groove are concurrently located inside a projection zone of the second separation groove.

20 Claims, 3 Drawing Sheets

STACKED-LAYERED THIN FILM SOLAR CELL AND MANUFACTURING METHOD THEREOF

BACKGROUND OF THE INVENTION

1. Technical Field

The present invention relates to a stacked-layered thin film solar cell and a manufacturing method thereof. More particularly, the present invention relates to a stacked-layered thin film solar cell and a manufacturing method thereof wherein a connection groove and a third separation groove are configured inside a projection zone of a second separation groove so to prevent short-circuit faults.

2. Description of Related Art

Please refer to FIGS. 1A and 1B for a conventional stacked-layered thin film solar cell 1, which comprises a substrate 14, a first electrode layer 11, a semi-conductor layer 13, and a second electrode layer 12 in a series stacked structure. In a manufacturing process of such stacked-layered thin film solar cell 1, the substrate 14 is firstly deposited with the first electrode layer 11 and then receives a laser scribing treatment so as to form a plurality of unit cells 112 and first grooves 111. Then the first electrode layer 11 is deposited thereon with the semi-conductor layer 13, and the semi-conductor layer 13 is such laser scribed that each semi-conductor scribed groove 131 is distant from a said scribed groove of the first electrode layer 11 by about 100 microns. Afterward, the semi-conductor layer 13 is deposited thereon with a second electrode layer 12, and the second electrode layer 12 as well as the semi-conductor layer 13 are such laser scribed that each resultant scribed groove 121 is distant from a said semi-conductor scribed groove 131 by about 100 microns. By the foregoing deposited layers and laser scribing processes performed on each said layer, the stacked-layered thin film solar cell 1 composed of the unit cells 112 in serial is so established.

In a following packaging process, for eliminating problems about short-circuit faults and electric leakage, U.S. Pat. No. 6,300,556 proposes a method involving forming an isolation groove 15 by scribing the solar cell near a periphery thereof for partially removing the first electrode layer, the semi-conductor layer and the second electrode layer, and then mechanically removing the first electrode layer, the semi-conductor layer and the second electrode layer or films of the three layers outside the isolation groove 15 near a periphery of the substrate. Besides, the disclosure of U.S. Pat. No. 6,271,053 involves depositing the layers, dividing the deposited layers into serially connected solar cells, removing the second electrode layer and semi-conductor layer at peripheries of the unit cells so as to reveal the semi-conductor layer, and then thermally processing the revealed semi-conductor layer to oxidize its surface and thereby increase its resistance. Otherwise, US Patent Publication 2006/0,266,409 reveals the first electrode layer by removing the second electrode layer and the semi-conductor layer with a first laser before using a second laser to remove portions of the second electrode layer, the semi-conductor layer and the first electrode layer that have not been removed by the first laser.

In the above technology, for forming the isolation grooves, due to diverseness of the films, the first laser of a certain wavelength is used to remove the second electrode layer and the semi-conductor layer so as to form scribed grooves, and to repeatedly scribe the scribed isolation grooves to widen the same in order to enhance accurateness of a cutting process later performed on the first electrode layer. Afterward, the second laser of another wavelength is employed to cut the first electrode layer. Since the isolation grooves are formed by two types of laser beams of different wavelengths, the manufacturing procedures are complicated and therefore equipment costs as well as manufacturing cycle are enlarged. Furthermore, after the cutting process is performed, due to possible unevenness of the laser beams, part of the second electrode layer may be not fully removed and, in its melt state, remains on the first electrode layer, leading to short-circuit faults. Though using a single type of laser in length to process the three layers facilitates simplifying the manufacturing procedures, it is notable that the resultant thermal effect is greater and thus the induced short-circuit problem is more significant. Moreover, when thermal treatment is implemented at the late stage of the manufacturing procedures to oxidize the semi-conductor layer and thereby increase its resistance for averting the short-circuit problem, equipment costs and manufacturing cycle can be accordingly increased.

On the other hand, due to recombination of electrons and holes and loss of light, photoelectric conversion efficiency in a stacked-layered thin film solar cell is limited. Thus, an interlayer is usually arranged between a material of a higher energy level and another material of a lower energy level so that when light passes through the stacked-layered thin film solar cell, a portion of the light having short wavelengths that can be absorbed by the material of the higher energy level is reflected to extend a light path while a portion of the light having long wavelengths that can not be absorbed by the material of the higher energy level is led to the material of the lower energy level so as to improve light transmission. For example, U.S. Pat. No. 5,021,100 proposes a dielectric selective reflection film in a stacked-layered thin film solar cell. Since the interlayer, for connecting materials of different energy levels, possesses electric conductivity, electric leakage and short-circuit faults can easily happen during an edge isolating process of the interlayer. Therefore, U.S. Pat. No. 6,632,993 further provides cutting grooves 161 scribed on the interlayer 16 for eliminating electric leakage when a current passes through the interlayer 16, as shown in FIG. 1C. U.S. Pat. No. 6,870,088 also suggests a similar approach but further provides scribed grooves 181 on a photoelectric conversion layer between cutting grooves 171, as shown in FIG. 1D, so as to eliminate the above-mentioned problems. However, all of the above-mentioned conventional approaches were aimed to prevent short-circuit faults of the connection grooves and the interlayer but fail to address solutions to short-circuit faults of the scribe grooves that divide the entire solar cell into unit cells.

SUMMARY OF THE INVENTION

In view of the defects of the conventional devices, the present invention provides a stacked-layered thin film solar cell and a manufacturing method thereof. The stacked-layered thin film solar cell has a plurality of independent unit cells each comprising a substrate, a first electrode layer, a first photoconductive layer, an interlayer, a second photoconductive layer, and a second electrode layer in a series stacked structure, wherein at least one first separation groove is formed within the first electrode layer. It is characterized in that at least one second separation groove (inner scribe groove) is formed on the interlayer and at least one connection groove passes through the first photoconductive layer and the second photoconductive layer while at least one third separation groove (outer scribe groove) extending downward is formed at a periphery of each of the unit cells so that the connection groove and the third separation groove are concurrently located inside the second separation groove.

Hence, a primary objective of the present invention is to provide a stacked-layered thin film solar cell, wherein a connection groove and a scribe groove of a unit cell are concurrently located inside a projection zone of a scribe groove within an interlayer so as to prevent short-circuit faults of the scribe grooves in the unit cell and thereby optimize an isolation effect of the overall solar cell.

A secondary objective of the present invention is to provide a manufacturing method of a stacked-layered thin film solar cell, wherein in the solar cell a connection groove and a scribe groove of a unit cell are concurrently located inside a projection zone of a scribe groove within an interlayer so as to prevent short-circuit faults of the scribe grooves in the unit cell and thereby optimize an isolation effect of the overall solar cell.

BRIEF DESCRIPTION OF THE DRAWINGS

The invention as well as a preferred mode of use, further objectives and advantages thereof, will best be understood by reference to the following detailed description of an illustrative embodiment when read in conjunction with the accompanying drawings, wherein.

DETAILED DESCRIPTION OF THE PREFERRED EMBODIMENT

While the present invention discloses a stacked-layered thin film solar cell and a manufacturing method thereof, those skilled in the art will recognize and appreciate that the principle of solar photoelectric conversion implemented therein is well known and need not be discussed at any length herein. Meantime, the accompanying drawings for being read in conjunction with the following descriptions are aim to express features of the present invention and need not to be made in scale.

Figure 1A:
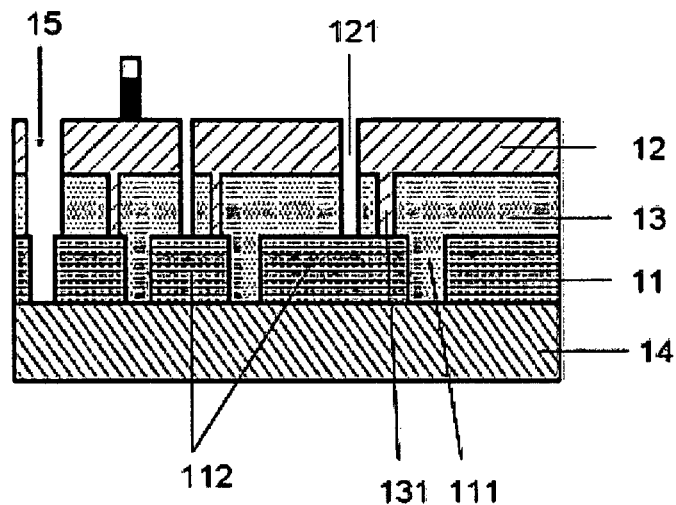
FIGS. 1A and 1D are schematic drawings showing a conventional stacked-layered thin film solar cell.
Figure 1B:
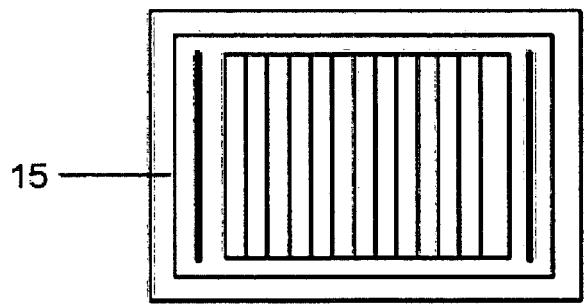
Figure 1C:
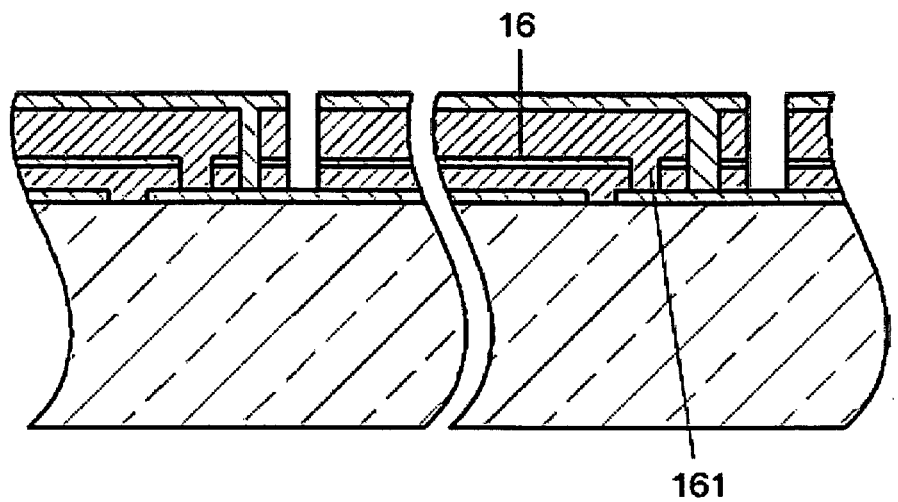
Figure 1D:
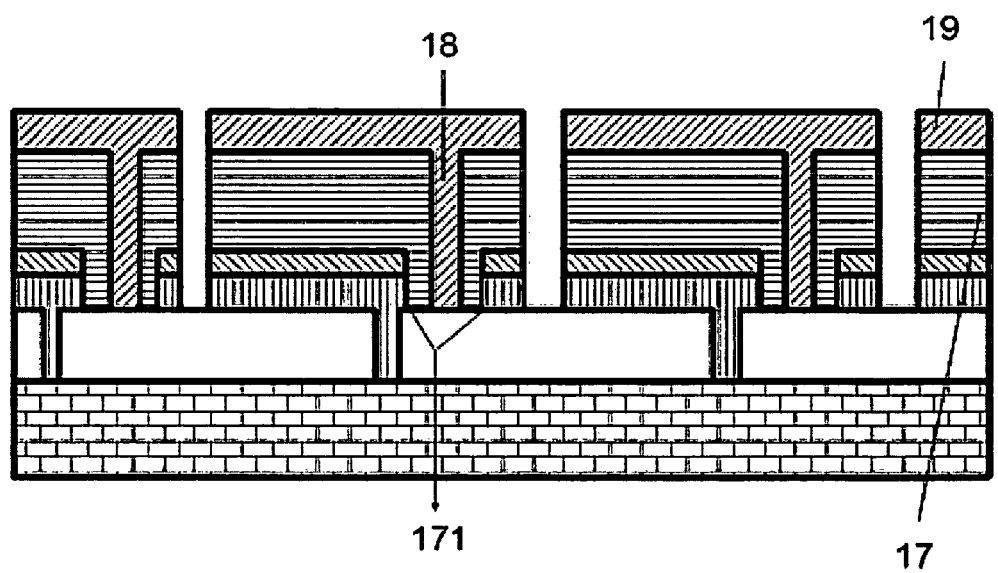
Figure 2:
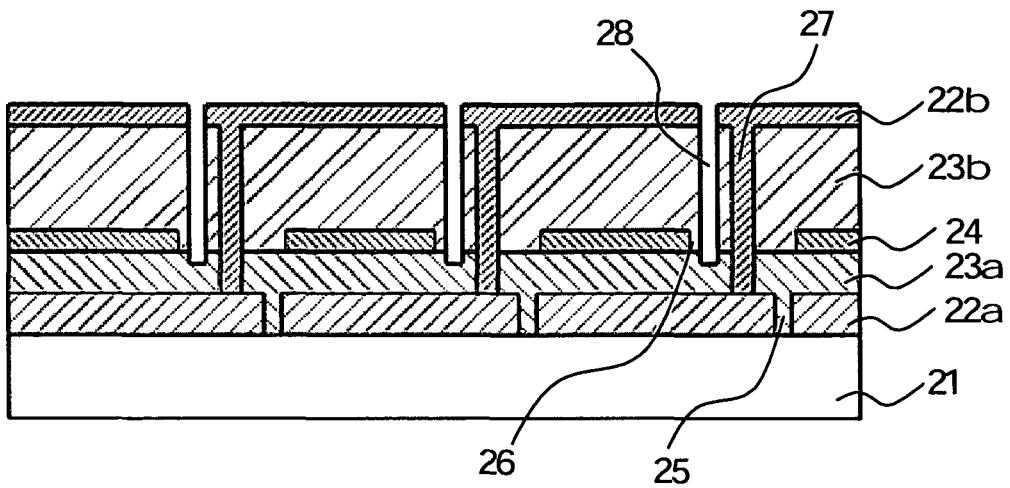
FIG. 2 is a cross-sectional view of a stacked-layered thin film solar cell of the present invention.

Please refer to FIG. 2 for a first preferred embodiment of the present invention. Therein, a stacked-layered thin film solar cell 2 is composed of a plurality of independent unit cells 20. Each of the unit cells 20 comprises a substrate 21, a first electrode layer 22a, a first photoconductive layer 23a, an interlayer 24, a second photoconductive layer 23b, and a second electrode layer 22b in a series stacked structure. A first separation groove 25 is formed on the first electrode layer 22a, and a second separation groove 26 is formed on the interlayer 24, while a connection groove 27 passes through the first photoconductive layer 23a and the second photoconductive layer 23b. In addition, a third separation groove 28 is formed between each two adjacent said independent unit cells 20. The first separation groove 25 extends downward to partially remove the first electrode layer 22a while the third separation groove 28 extends downward from the second electrode layer 22b to partially remove the first photoconductive layer 23a. Thereby, since the connection groove 27 and the third separation groove 28 are concurrently located inside a projection zone of the second separation groove 26, short-circuit faults of the third separation grooves 28 between the unit cells 20 can be prevented and an isolation effect of the overall solar cell 2 can be optimized.

In the aforementioned embodiment, the unit cells 20 may be electrically connected in series connection, in parallel connection or in series-parallel connection. The substrate 21 is made of a transparent material. The first electrode layer 22a may have a single-layer structure or a multi-layer structure and may be made of a TCO (Transparent Conductive Oxide), wherein the TCO may be any one of SnO2, ITO, ZnO, AZO, GZO and IZO. The second electrode layer 22b may have a single-layer structure or a multi-layer structure. When the second electrode layer 22b is purely made of a metal material, the metal material may be any one of Ag, Al, Cr, Ti, Ni, Au and an alloy of any of the above metals. When the second electrode layer 22b is made of a metal and a TCO, the metal may be any one of Ag, Al, Cr, Ti, Ni, Au and an alloy of any of the above metals and the TCO may be any one of $SnO_2$, ITO, ZnO, AZO, GZO or IZO. The photoconductive layers 23a, 23b may be structures of any one of single-crystal Si, multi-crystal Si, non-crystal Si, micro-crystal Si, Ge, SiGe and SiC. The interlayer 24 may be made of any one of ITO, ZnO, AZO, GZO and IZO.

In the aforementioned embodiment, the first electrode layer 22a may be formed on the substrate 21 by a sputtering process, an APCVD (Atmospheric Pressure Chemical Vapor Deposition) process, or an LPCVD (Low Pressure Chemical Vapor Deposition) process. The photoconductive layers 23a, 23b are formed on the first electrode layer 22a by a deposition process. The interlayer 24 is formed on the first photoconductive layer 23a by a deposition process. The second electrode layer 22b may be formed on the second photoconductive layer 23b by a sputtering process or a PVD (Physical Vapor Deposition) process. Besides, the first separation groove 25 is formed by a laser scribing process or a mechanical scribing process and has a width ranging from 15 microns to 120 microns. The second separation groove 26 is formed by a laser scribing process, a mechanical scribing process, a wet etching process or a dry etching process and has a width ranging from 80 microns to 300 microns. The connection groove 27 is formed by a laser scribing process, a mechanical scribing process, a wet etching process or a dry etching process and has a width ranging from 15 microns to 120 microns. The third separation groove 28 is formed by a laser scribing process, a mechanical scribing process, a wet etching process or a dry etching process and has a width ranging from 15 microns to 120 microns. Moreover, the connection groove 27 and the third separation groove 28 are separated from each other by a distance ranging from 50 microns to 270 microns.

Figure 3:
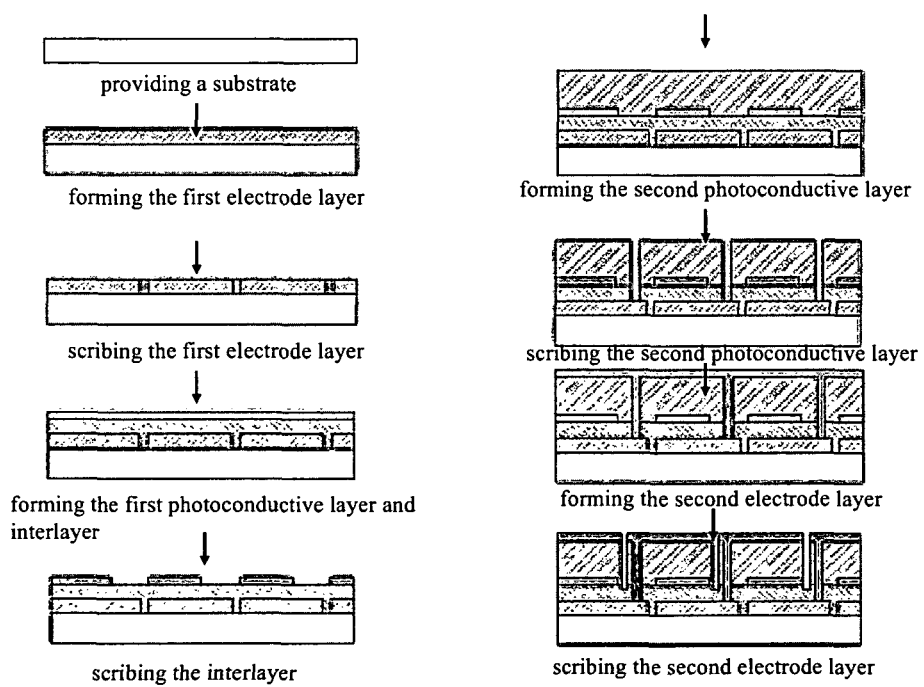
FIG. 3 is a schematic drawing illustrating a manufacturing method of the stacked-layered thin film solar cell of the present invention.

Please refer to FIG. 3 for a second embodiment of the present invention providing a manufacturing method of a stacked-layered thin film solar cell so as to prevent short-circuit faults of the scribe grooves in the unit cell and thereby optimize an isolation effect of the overall solar cell. The disclosed manufacturing method comprises steps of:

(1) Providing a substrate and forming a first electrode layer on the substrate;

(2) Forming a first separation groove extending downward on the first electrode layer, wherein the first separation groove is formed by using a scribing process to partially remove the first electrode layer along a depth direction thereof;

(3) Forming a first photoconductive layer on the first electrode layer and forming an interlayer on the first photoconductive layer;

(4) Forming a second separation groove extending downward on the interlayer, wherein the second separation groove is formed by using a scribing process to remove the interlayer along a depth direction thereof while the first separation groove and the second separation groove are mutually parallel and deviant;

(5) Forming a second photoconductive layer on the interlayer;

(6) Forming a connection groove extending downward from the second photoconductive layer to a border between the first photoconductive layer and the first electrode layer, wherein the connection groove is formed by using a scribing process to remove the second photoconductive layer and the first photoconductive layer along a depth direction thereof while the connection groove is located inside a projection zone of the second separation groove;

(7) Forming a second electrode layer on the second photoconductive layer; and (8) Forming a third separation groove extending downward from the second electrode layer to a part of the first photoconductive layer, wherein the third separation groove is formed by using a scribing process to remove the second electrode layer, the second photoconductive layer and the part of the first photoconductive layer along a depth direction thereof while the third separation groove and the connection groove are concurrently located inside the projection zone of the second separation groove and are mutually adjacent, parallel and deviant.

In the above embodiment, the substrate 21, the first electrode layer 22a, the first photoconductive layer 23a, the interlayer 24, the second photoconductive layer 23b, and the second electrode layer 22b, the first separation groove 25, the second separation groove 26, the connection groove 27 and the third separation groove 28 share the same structural and features and forming methods of their resemblances described in the first embodiment. Therein, the scribing process may be a laser scribing process, a mechanical scribing process, a wet etching process or a dry etching process.

Although the particular embodiments of the invention have been described in detail for purposes of illustration, it will be understood by one of ordinary skill in the art that numerous variations will be possible to the disclosed embodiments without going outside the scope of the invention as disclosed in the claims.

What is claimed is:

1. A stacked-layered thin film solar cell, constructed of a plurality of individual unit cells each comprising a substrate, a first electrode layer, a first photoconductive layer, an interlayer, a second photoconductive layer, and a second electrode layer in a series stacked structure, wherein at least one first separation groove is formed within the first electrode layer, the stacked-layered thin film solar cell characterized in that:
at least one second separation groove formed on the first photoconductive layer by removing only parts of the interlayer without exposing the first electrode layer so as to prevent the second photoconductive layer from directly contacting with the first electrode layer,
at least one connection groove passing through the first photoconductive layer and the second photoconductive layer, and
at least one third separation groove extending downward at a periphery of each of the unit cells and extending downward to remove a part of the first photoconductive layer in depth without exposing the first electrode layer;
wherein the connection groove and the third separation groove are concurrently located inside the second separation groove,
wherein a bottom of the third separation groove is kept with a distance from the first electrode layer.

2. The stacked-layered thin film solar cell as claimed in claim 1, wherein the first separation groove further extends downward to remove a part of the first electrode layer.

3. The stacked-layered thin film solar cell as claimed in claim 1, wherein each of the unit cells has the first separation groove of a width ranging from 15 microns to 120 microns, the second separation groove of a width ranging from 80 microns to 300 microns, the third separation groove of a width ranging from 15 microns to 120 microns, and the connection groove of a width ranging from 15 microns to 120 microns.

4. The stacked-layered thin film solar cell as claimed in claim 1, wherein the connection groove and the third separation groove are separated from each other by a distance ranging from 50 microns to 270 microns.

5. The stacked-layered thin film solar cell as claimed in claim 1, wherein the connection groove, the first separation groove, the second separation groove, or the third separation groove is formed by a laser scribing process or a mechanical scribing process.

6. The stacked-layered thin film solar cell as claimed in claim 1, wherein the connection groove, the second separation groove, or the third separation groove is formed by a process selected from a group consisting of a wet etching process and a dry etching process.

7. The stacked-layered thin film solar cell as claimed in claim 1, wherein the substrate is made of a transparent material.

8. The stacked-layered thin film solar cell as claimed in claim 1, wherein the first electrode layer is made of a TCO (Transparent Conductive Oxide) of a material selected from a group consisting of SnO2, ITO, ZnO, AZO, GZO and IZO.

9. The stacked-layered thin film solar cell as claimed in claim 1, wherein the second electrode layer is a metal layer made of a material selected from a group consisting of Ag, Al, Cr, Ti, Ni and Au.

10. The stacked-layered thin film solar cell as claimed in claim 1, wherein the second electrode layer is composed of a metal layer and a TCO (Transparent Conductive Oxide), in which the TCO is made of a material selected from a group consisting of SnO2, ITO, ZnO, AZO, GZO and IZO.

11. The stacked-layered thin film solar cell as claimed in claim 1, wherein the first electrode layer is formed on the substrate by a process selected from a group consisting of a sputtering process, an APCVD (Atmospheric Pressure Chemical Vapor Deposition) process and an LPCVD (Low Pressure Chemical Vapor Deposition) process.

12. The stacked-layered thin film solar cell as claimed in claim 1, wherein the first electrode layer has a single-layer structure or a multi-layer structure while the second electrode layer has a single-layer structure or a multi-layer structure.

13. The stacked-layered thin film solar cell as claimed in claim 1, wherein the photoconductive layers are formed on the first electrode layer by a deposition process.

14. The stacked-layered thin film solar cell as claimed in claim 1, wherein the photoconductive layers are made of a material selected from a group consisting of single-crystal Si, multi-crystal Si, non-crystal Si, micro-crystal Si, Ge, SiGe and SiC.

15. The stacked-layered thin film solar cell as claimed in claim 1, wherein the interlayer is made of a material selected from a group consisting of ITO, ZnO, AZO, GZO and IZO.

16. The stacked-layered thin film solar cell as claimed in claim 1, the interlayer is formed on the first photoconductive layer by a deposition process and the second electrode layer is formed on the second photoconductive layer by a process selected from a group consisting of a sputtering process, and a PVD (Physical Vapor Deposition) process.

17. The stacked-layered thin film solar cell as claimed in claim 1, wherein the unit cells are electrically connected in series connection, in parallel connection or in series-parallel connection.

18. A manufacturing method of a stacked-layered thin film solar cell that is constructed of a plurality of unit cells, comprising:

provilding a substrate and forming a first electrode layer on the substrate;

forming at least one first separation groove extending downward within the first electrode layer, forming a first photoconductive layer on the first electrode layer and forming an interlayer on the first photoconductive layer;

forming at least one second separation groove within the interlayer by removing only parts of the interlayer without exposing the first electrode layer, wherein the first separation groove and the second separation groove are separated from each other;

forming a second photoconductive layer on the first photoconductive layer and the partially removed interlayer without directly contacting with the first electrode layer;

forming at least one connection groove within the second photoconductive layer downward extending to a border located between the first photoconductive layer and the first electrode layer, wherein the connection groove is located inside the second separation groove;

forming a second electrode layer on the second photoconductive layer; and forming at least one third separation groove within the second electrode layer extending downward to a part of the first photoconductive layer in depth without exposing the first electrode layer, wherein the third separation groove is located inside the second separation groove and adjacent to the connection groove, and a bottom of the third separation groove is kept with a distance from the first electrode layer.

19. The manufacturing method as claimed in claim 18, wherein the first separation groove, the second separation groove, the third separation groove and the connection groove are formed by a laser scribing process, a mechanical scribing process, a dry etching process or a wet etching process.

20. The manufacturing method as claimed in claim 18, wherein the first photoconductive layer, the interlayer and the second photoconductive layer are formed by a deposition process.

\* \* \* \* \*